United States Patent
Cheng et al.

(10) Patent No.: US 6,812,720 B1
(45) Date of Patent: Nov. 2, 2004

(54) MODULARIZED PROBE CARD WITH COAXIAL TRANSMITTERS

(75) Inventors: Shih-Jye Cheng, Hsinchu (TW); An-Hong Liu, Tainan (TW); Yeong-Her Wang, Tainan (TW); Yuan-Ping Tseng, Hsinchu (TW); Yao-Jung Lee, Tainan (TW)

(73) Assignees: Chipmos Technologies (Bermuda) Ltd., Hamilton (BM); Chipmos Technologies Inc., Hsinchu (TW)

( * ) Notice: Subject to any disclaimer, the term of this patent is extended or adjusted under 35 U.S.C. 154(b) by 0 days.

(21) Appl. No.: 10/417,263

(22) Filed: Apr. 17, 2003

(51) Int. Cl.[7] ............................................. G01R 31/02
(52) U.S. Cl. .................... 324/755; 324/754; 324/756
(58) Field of Search ................. 324/754–762, 324/72, 158.1

(56) References Cited

U.S. PATENT DOCUMENTS

| | | | | |
|---|---|---|---|---|
| 3,806,801 A | * | 4/1974 | Bove ........................... | 324/72.5 |
| 3,911,361 A | * | 10/1975 | Bove et al. .................. | 324/761 |
| 4,731,577 A | | 3/1988 | Logan ......................... | 324/754 |
| 4,733,172 A | * | 3/1988 | Smolley ...................... | 324/754 |
| 4,795,977 A | * | 1/1989 | Frost et al. .................. | 324/537 |
| 4,931,726 A | * | 6/1990 | Kasukabe et al. ........... | 324/754 |
| 5,187,431 A | * | 2/1993 | Libretti ....................... | 324/754 |
| 5,525,911 A | * | 6/1996 | Marumo et al. ............. | 324/754 |
| 5,906,511 A | * | 5/1999 | Bozzer et al. ............... | 439/579 |
| 6,547,593 B1 | * | 4/2003 | Beckous ...................... | 439/581 |
| 6,621,710 B1 | * | 9/2003 | Cheng et al. ................ | 361/774 |

* cited by examiner

Primary Examiner—Kamand Cuneo
Assistant Examiner—Paresh Patel
(74) Attorney, Agent, or Firm—Dennison, Schultz, Dougherty & MacDonald

(57) ABSTRACT

A modularized probe card with coaxial transmitter is disclosed. At least a coaxial transmitter is modularized and installed between a first printed circuit board and a second printed circuit board. The coaxial transmitter has a first connector and a second connector correspondingly connecting two ends of each coaxial cable of the coaxial transmitter for electrically connecting corresponding in location to first printed circuit board and second printed circuit board. A probe head is bonded on second printed circuit board. The second connector of the coaxial transmitter is connected with the second printed circuit board in a plug-in and pull-away type.

11 Claims, 3 Drawing Sheets

MODULARIZED PROBE CARD WITH COAXIAL TRANSMITTERS

FIELD OF THE INVENTION

The present invention relates to a probe card for testing semiconductor wafers and, more specifically, to a modularized probe card with coaxial transmitters.

BACKGROUND OF THE INVENTION

After fabrication, semiconductor devices will need to pass functional test to verify their electrical performance within design specification. The test apparatus for chip probing usually comprises a probe card with a plurality of probe needles for contacting with electrodes, such as bond pads or bumps, of a wafer.

A conventional improved probe card mainly comprises a substrate with a top and a bottom side. Both sides of the substrate are formed with a large ground plane and a plurality of contact points, wherein the ground plane is soldering with outer shields of coaxial cables to provide ground and shielding. The contact points provide electrical connections with a tester. The top side of the substrate is formed with a plurality of soldering points to solder a plurality of probe needles. A plurality of coaxial cables provide electrical connections between probe soldering points and contact points. The coaxial cable provides electrical connection respectively, therefore, it not only acquires more time in manufacturing rectangular probe card, but also comes up with the problem of improper connections or miss wiring between coaxial cables.

Furthermore, in U.S. Pat. No. 4,731,577 entitled "COAXIAL PROBE CARD", a multipoint microwave coaxial probe card is disclosed. A printed circuit board has edge connectors and a mounting ring attached to the surface. The mounting ring has a plurality of holes, and each is assembled with a microwave connector. These microwave connectors electrically connect to probe needles by coaxial cables. A portion of the probe needles are joined to the edge connector by insulated wires allowing both high and low frequency signals to be utilized simultaneously. Furthermore, a shield in the form of a flat plate, with a cover, encloses the ring and provides RFI and EMI shielding, and allows the coaxial probe card to test the microwave semiconductor wafers. However, non-modularized coaxial probe card is not easily to be detached and assembled, and therefore it is difficult to repair once malfunction occurs.

SUMMARY OF THE INVENTION

A main purpose of the present invention is to supply a modularized probe card with coaxial transmitters. At least a coaxial transmitter is modularized and installed between a first printed circuit board and a second printed circuit board. When it requires to test another semiconductor devices with same electrical function yet different pad distribution, the whole probe card can be reused except the probe head. A new probe head corresponding to the semiconductor devices manufactured and assembled to the second printed circuit board to save the cost of manufacturing a new probe card.

A second purpose of the present invention is to supply a modularized probe card with coaxial transmitters with both ends of each coaxial cable connecting to plug-in and pull-away type connectors. These connectors are used to collect and fasten coaxial cables of coaxial transmitters, and to electrically connect with the first and second printed circuit boards. This will eliminate the problem of improper connections for individual coaxial cables, and reduce the assembly time of a probe card.

A third purpose of the present invention is to supply a modularized probe card with coaxial transmitters installing at least a coaxial cable. The coaxial cable is easily to be replaced with new one and thus to ensure that coaxial cable is always in good electrical function. Furthermore, miss wiring could be eliminated and it is easy to repair the probe card once malfunction occurs.

The modularized probe card with coaxial transmitters according to the present invention comprises at least a coaxial transmitter, a first printed circuit board, a second printed circuit board, and a probe head. Wherein the coaxial transmitter is composed of a first connector, a second connector and a plurality of coaxial cables. It is modularized and installed between the first and the second printed circuit board, as a transmitting route for probing wafers. One ends of the coaxial cables are connected to the first connector, and correspondingly connected to the first connecting devices of first printed circuit board. The other ends of the coaxial cables are connected to the second connector, and correspondingly connected to the second connecting devices of second printed circuit board in a plug-in and pull-away type. The probe head is mounted and electrically connected to the second printed circuit board, and forming with a plurality of probes for contacting semiconductor wafers.

DETAIL DESCRIPTION OF THE INVENTION

Please refer to the drawings attached, the present invention will be described by means of an embodiment below.

Figure 1:
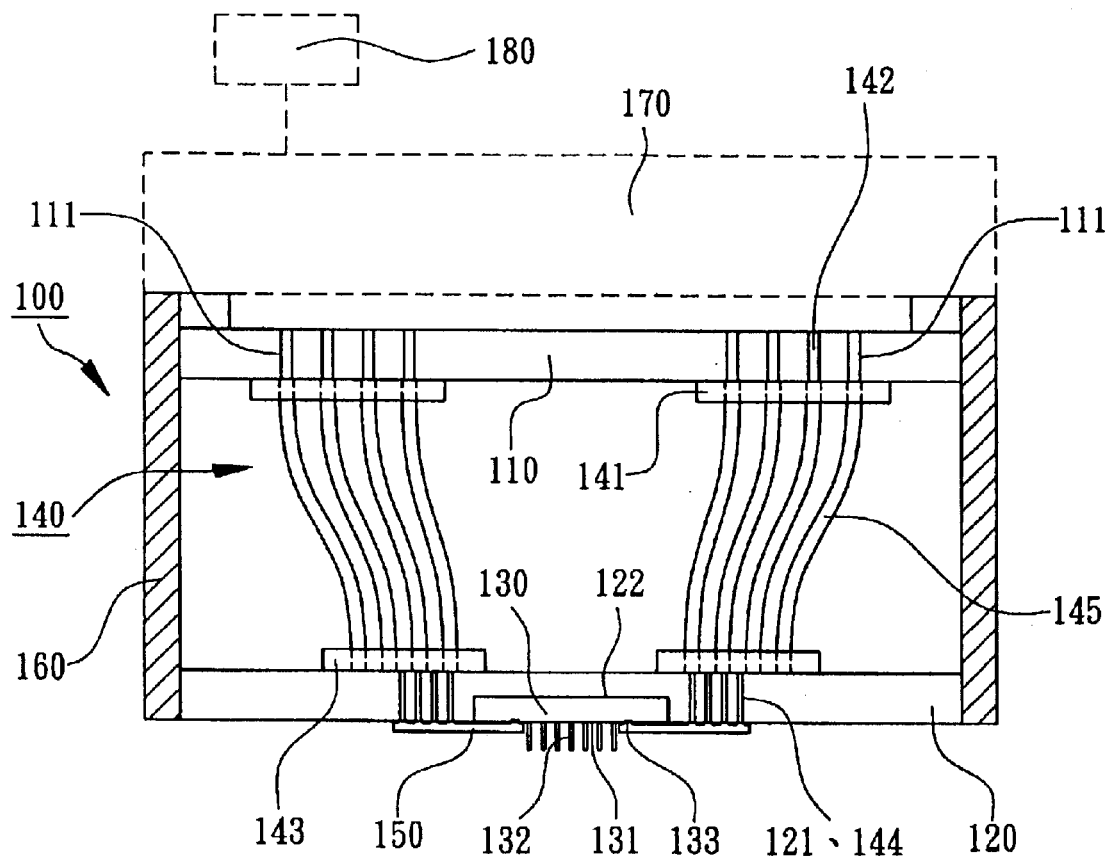
FIG. 1 is a cross-sectional view of a modularized probe card with coaxial transmitters in accordance with the first embodiment of the present invention.
Figure 3:
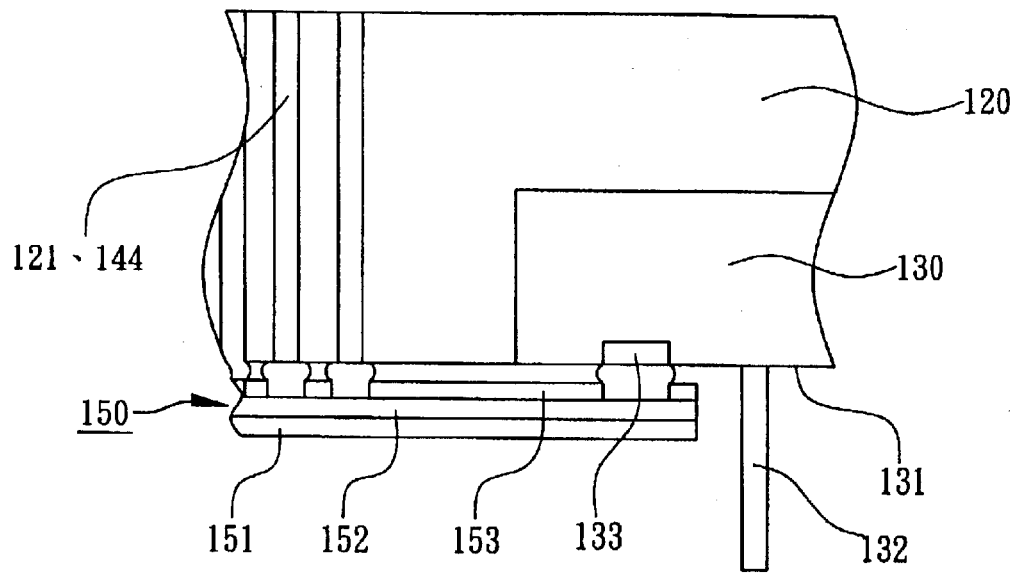
FIG. 3 is a partial amplification of the cross-sectional view of the probe card in accordance with the first embodiment of the present invention.

As shown in FIG. 1, in the first embodiment in accordance with present invention a modularized probe card 100 is used for installing on a test head 170, and electrically connects to a tester 180, for electrical contact with semiconductor wafers under test. The probe card 100 comprises a first printed circuit board 110, a second printed circuit board 120, a probe head 130, and at least a coaxial transmitter 140. Wherein the first printed circuit board 110 is functioned as a connection interface between the test head 170 and the probe card 100, and is able to connect to the tester 180. A plurality of first connecting devices 111, such as vias and connecting sockets, are mounted on the first printed circuit board 110 to plug in the first connector 141 of coaxial transmitter 140. The inner portion of first printed circuit board 110 has a plurality of circuits (not shown in figure) to provide electrical connections between the first connecting devices 111 and test head 170. The second printed circuit board 120 is functioned as a transmission interface between probe head 130 and the first printed circuit board 110. The second printed circuit board 120 has a plurality of second connecting devices 121, such as vias and sockets, to plug in the second connector 143 of coaxial transmitter 140. In this embodiment, the second connecting devices 121 are vias. The arrangement density of the second connecting devices 121 on second printed circuit board 120 is higher than that of the first connecting devices 111 on first printed circuit board 110. Furthermore, second connecting devices 121 are installed around the edge of probe head 130, which connects to the second printed circuit board 120. It is preferable that the second printed circuit board 120 be arranged with a slot 122 to place and fasten probe head 130, which may be a silicon substrate or multi-layer ceramic substrate with a plurality of probing points 132, such as probe needles or bumps, arranging on the surface 131 to contact with bond pads of semiconductor wafers. ( not shown in figure ). In this embodiment, as shown in FIG. 3, a plurality of contact pads 133, which electrically connecting to corresponding probing points 132, are arranging on the edge of surface 131 of probe head 130. Furthermore, the contact pads 133 are electrically connecting to the second connection devices 121 of second printed circuit board 120 with electrical connecting devices 150. The electrical connecting devices 150 could be bonding wires or flexible printed circuit. In this embodiment, the electrical connecting device 150 is a flexible printed circuit, mainly comprising a flexible insulation layer 151, such as polyimide. A plurality of metal traces 152 are formed on one surface of the flexible insulation layer 151 for electrically connecting with contact pads 133 of probe head 130 and the second connecting devices 121 of the second printed circuit board 120. Besides, the traces 152 on the flexible insulation layer 151 are shielded with a cover layer 153 to strengthen the structure of electrical connecting device 150.

Figure 2:
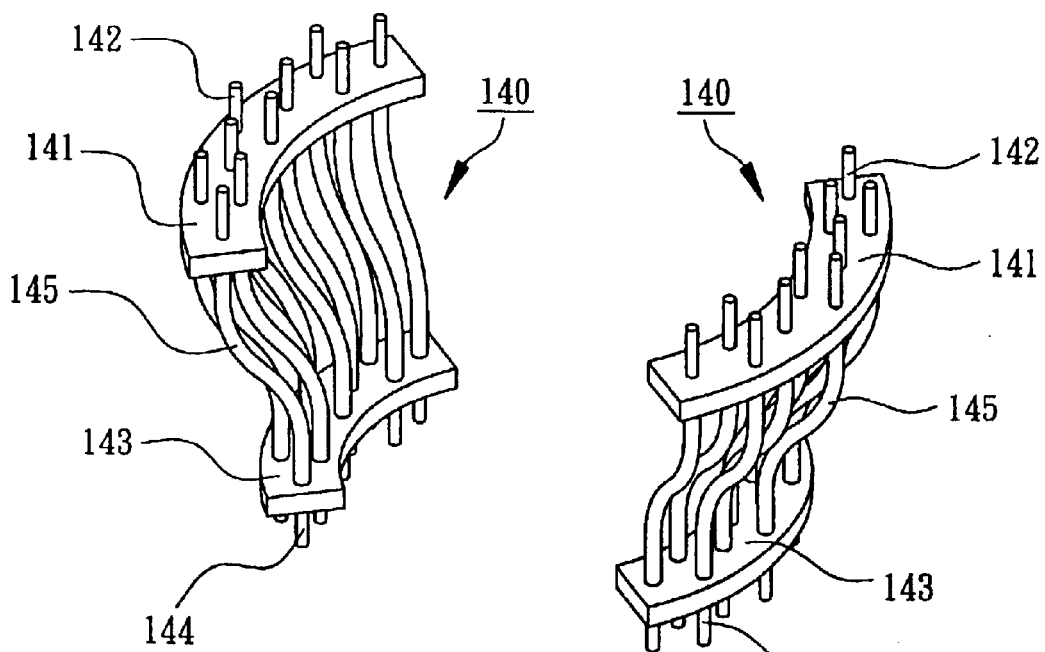
FIG. 2 is a three-dimensional view of the coaxial transmitters in accordance with the first embodiment of the present invention.

In this embodiment, as shown in FIG. 1 and 2, a plurality of coaxial transmitters 140 are installed between the first printed circuit board 110 and the second printed circuit board 120 as a transmission route for probe card 100 while proceeding electrical testing. Each of coaxial transmitter 140 comprises a first connector 141, a second connector 143 and a plurality of coaxial cables 145. The first connector 141 or second connector 143 could be a plug-in connector. The coaxial cables 145 effectively prevent the signal interferences producing according to the Faraday's law, and completely obstructs cross-talk causing by over-density of circuits or high frequency testing. In this embodiment, the first connector 141 and the second connector 143 are shaping as curves wherein one surface of first connector 141 is formed with a plurality of pins 142, which correspondingly connect to coaxial cables 145 with one end fasten to the first connector 141. The second connector 143 also has a plurality of pins 144, which correspondingly connect to coaxial cables 145 with the other end fasten to the second connector 143. It is preferable that pins 142 or pins 144 be arrayed in zigzag format to allow more of pins 142 and pins 144 be formed on surfaces of the first connector 141 and second connector 143, and furthermore, the second connector 143 be connected to the second connecting devices 121 of second printed circuit board 120 in a plug-in and pull-away type (not connecting by soldering). When probe card 100 is assembled, first pins 142 of coaxial transmitters 140 are corresponding in location to the first connecting devices 111 of first printed circuit board 110, and the second connector 143 is corresponding in location to the second connecting devices 121, of second printed circuit board 120. It is preferable that the first and second printed circuit board 110,120 be fastened by a shell 160 while testing semi-conductor wafers.

Probe card 100 is assembled to have dual functions for testing semi-conductor wafers which have same electrical function yet with different pad distribution. The first printed circuit board 110 the second printed circuit board 120 and coaxial transmitters 140 are reusable, and only the probe head 130 corresponding in location to different semi-conductor wafers under test needs to be manufactured. The probe head 130 can be pulled away and plugged into the second printed circuit board 120, and assembled with the first printed circuit board 110 and coaxial transmitter 140 as mentioned above, to produce a probe card for different semi-conductor wafers under test. Therefore, its assembling parts are interchangeable and more flexible in assemble. Furthermore, the second connector 143 of coaxial transmitter 140 can be repeatedly pulled away and plugged into the second printed circuit board 120 which makes it more convenient in changing and repairing parts. Also, it does not need to connect coaxial cables one by one, which makes it more easily to assemble, and thus ensures that the coaxial transmitter 140 in correct electrical connection and no miss wiring. The coaxial transmitter 140 is modularly installed between the first and second printed circuit board 110,120, and the first connector 141 and second connector 143 are utilized so as to acquire fast assembling. It also makes the repairing and assembling of probe card 100 more easily and quickly because it does not require to assemble individual coaxial cables 145 between the first printed circuit board 110 and second printed circuit board 120. Furthermore, coaxial cables 145 are positioned by the first connector 141 and second connector 143, therefore, improper connections or miss wiring between coaxial cables 145 will not occur.

Figure 4:
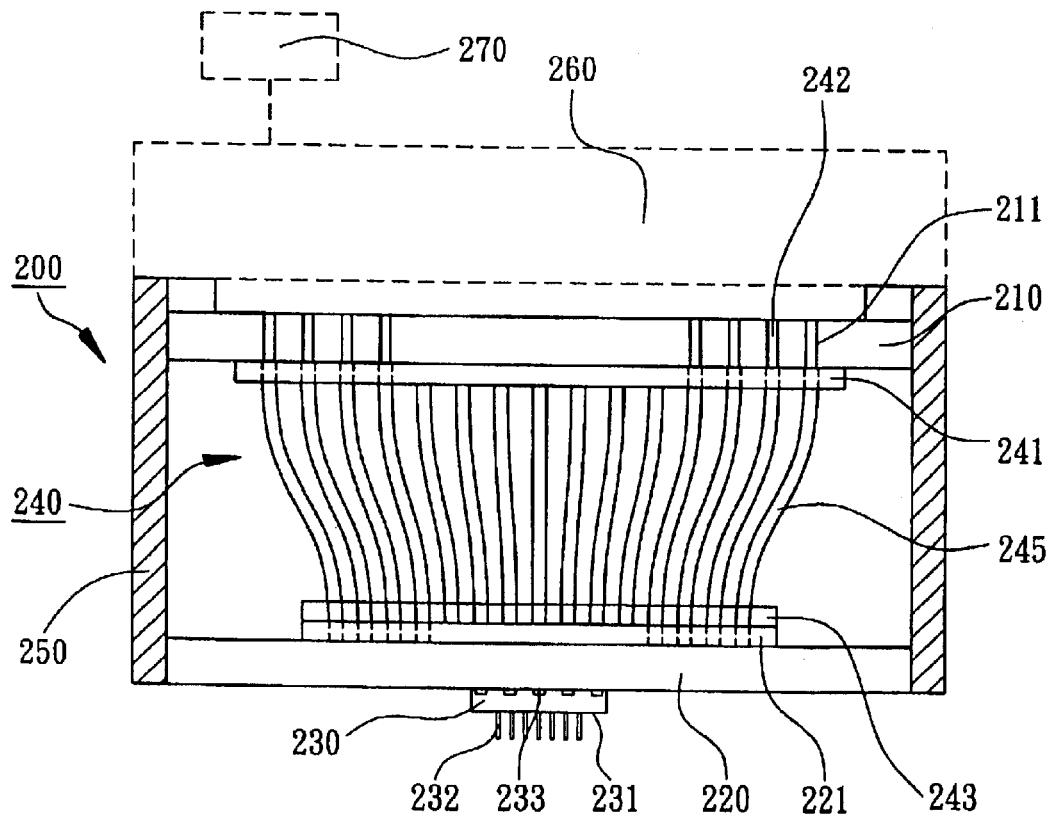
FIG. 4 is a cross-sectional view of a modularized probe card with coaxial transmitters in accordance with the second embodiment of the present invention.

The second embodiment in accordance with the present invention, as shown in FIG. 4, a modularized probe card 200 is installed on a test head 260 and electrically connecting to a tester 270 for electrically probing a semiconductor wafer under test. Probe card 200 comprises a first printed circuit board 210, a second printed circuit board 220, a 27 probe head 230 and at least a coaxial transmitter 240. Wherein the first printed circuit board 210 is formed with a plurality of first connecting devices 211 for pluging into the first connector 241 of coaxial transmitter 240, such as PTH type socket connectors. The second printed circuit board 220 is formed with a plurality of second connecting devices 221, such as slots, for plugging into the second connector 243 of coaxial transmitter 240. In this embodiment, probe head 230 is a multi-layer ceramic wiring board connecting to the second printed circuit board through connecting pads 233. A plurality of probing points 232 are arranged on a surface 231 of probe head 230 for probing bonding pads of a semiconductor wafer.

Figure 5:
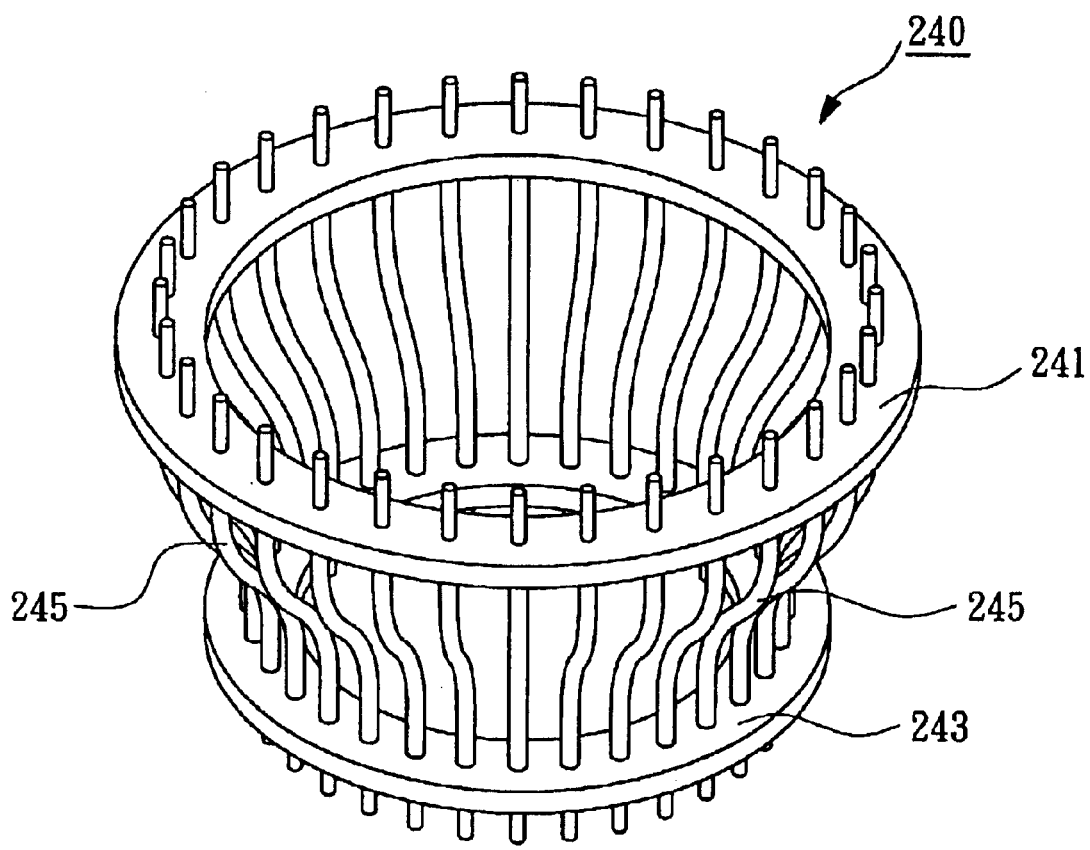
FIG. 5 is a three-dimensional view of the coaxial transmitters in accordance with the second embodiment of the present invention.

In this embodiment, as shown in FIGS. 4 and 5, a coaxial transmitter 240 is installed between the first printed circuit board 210 and second printed circuit board 220, as an internal transmitting route for probe card 200. The coaxial transmitter 240 comprises a first connector 241, a second connector 243 and a plurality of coaxial cables 245. In this embodiment, the first connector 241 and second connector 243 are shaping as curves, wherein two ends of each coaxial cable 245 are combined with the first connector 241 and second connector 243. The second connector 243 is configured for connecting with the second connecting device 221 of the second printed circuit board 220 in plug-in and pull-away type. While assembling probe card 200, it is to install the first connector 241 of coaxial transmitter 240 with the first connecting device 211 of first printed circuit board 210, and to install the second connector 243 with the second connecting device 221 of second printed circuit board 220. It is preferable that the first printed circuit board 210 and second printed circuit board 220 are fastened by a shell 250, and then proceed to test semiconductor wafers. When probe card 200 needs to test different semiconductor wafers with same electrical function yet different pad distribution, its first printed circuit board 210 and the second printed circuit board 220 and coaxial transmitter 240 are interchangeable, and only a probe head 230 corresponding in location to the semiconductor wafer under test needs to be assembled on the second printed circuit board 220. Therefore, the parts of a modularized probe card are interchangeable and more flexible in assembling probe cards and can be reuse for probing different semiconductor wafers under test.

Furthermore, coaxial transmitter 240 can be positioning and assembling quickly by the alignment of the first connector 241 and second connector 243. Therefore, signal disturbances will not happen between electrical connections of the first printed circuit board 210 with second printed circuit board 220, and neither will improper connections between coaxial cables 245 happen.

The above description of embodiments of this invention is intended to be illustrative and not limiting. Other embodiments of this invention will be obvious to those skilled in the art in view of the above disclosure.

What is claimed is:

1. A modularized probe card with coaxial transmitter comprising:
   a first printed circuit board having a plurality of first connecting devices;
   a second printed circuit board having a plurality of second connecting devices;
   a probe head combining and electrical connecting to the second printed circuit board, and mounting with a plurality of probing points on one surface for probing semiconductor wafers; and
   at least a coaxial transmitter comprising a first connector, a second connector and a plurality of coaxial cables, wherein the first connector is fastened and combined with one ends of the coaxial cables for connecting the first connecting devices of the fit printed circuit board, and the second connector is fastened and combined with the other ends of the coaxial cables for connecting the second connecting devices of the second printed circuit board in a plug-in and pull-away type.

2. The modularized probe card with coaxial transmitter according to claim 1, wherein the coaxial transmitter is installed between the first and the second printed circuit board.

3. The modularized probe card with coaxial transmitter according to claim 2, further comprising a shell fastening the first printed circuit board and the second printed circuit board for accommodating the coral transmitter.

4. The modularized probe card with coaxial transmitter according to claim 1, wherein the arrangement density of the second connecting devices of the second printed circuit board is higher than that of the first connecting devices of the first printed circuit board.

5. The modularized probe card with coaxial transmitter according to claim 1, wherein the first connector of the second connector is plug connector.

6. The modularized probe card with coaxial transmitter according to claim 5, wherein the first connector or the second connector comprises pins.

7. The modularized probe card with coaxial transmitter according to claim 6, wherein the pins are arrayed in zigzag format.

8. The modularized probe card with coaxial transmitter according to claim 1, wherein the second printed circuit board has a slot to connect with a probe head.

9. The modularized probe card with coaxial transmitter according to claim 1, wherein the probe head electrically connects to the second printed circuit board via flexible printed circuits.

10. The modularized probe card with coaxial transmitter according to claim 1, wherein the probe head is a silicon substrate or a ceramic wiring board.

11. The modularized probe card with coaxial transmitter according to claim 1, wherein the probing point are pins or bumps.

* * * * *